United States Patent
Leatherdale et al.

(10) Patent No.: US 7,390,117 B2
(45) Date of Patent: Jun. 24, 2008

(54) LED PACKAGE WITH COMPOUND CONVERGING OPTICAL ELEMENT

(75) Inventors: Catherine A. Leatherdale, St. Paul, MN (US); Andrew J. Ouderkirk, Woodbury, MN (US); Dong Lu, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 11/381,329

(22) Filed: May 2, 2006

(65) Prior Publication Data
US 2007/0258246 A1 Nov. 8, 2007

(51) Int. Cl.
*F21V 5/02* (2006.01)
(52) U.S. Cl. .................. 362/555; 362/800; 362/308
(58) Field of Classification Search ................ 362/800, 362/555, 560, 311, 307–309, 326
See application file for complete search history.

(56) References Cited

U.S. PATENT DOCUMENTS

| | | | |
|---|---|---|---|
| 3,596,136 A | 7/1971 | Fischer |
| 4,225,380 A | 9/1980 | Wickens |
| 4,675,058 A | 6/1987 | Plaster |
| 5,018,053 A | 5/1991 | Belknap et al. |
| 5,055,892 A | 10/1991 | Gardner et al. |
| 5,255,171 A | 10/1993 | Clark |
| 5,403,773 A | 4/1995 | Nitta et al. |
| 5,553,089 A | 9/1996 | Seki et al. |
| 5,578,839 A | 11/1996 | Nakamura et al. |
| 5,698,452 A | 12/1997 | Goossen |
| 5,724,376 A | 3/1998 | Kish, Jr. et al. |
| 5,747,832 A | 5/1998 | Nakamura et al. |
| 5,779,924 A | 7/1998 | Krames et al. |
| 5,793,062 A | 8/1998 | Kish, Jr. et al. |
| 5,925,898 A | 7/1999 | Späth |
| 6,091,020 A | 7/2000 | Fairbanks et al. |
| 6,280,063 B1 | 8/2001 | Fong et al. |
| 6,412,971 B1 | 7/2002 | Wojnarowski et al. |
| 6,429,462 B1 | 8/2002 | Shveykin |

(Continued)

FOREIGN PATENT DOCUMENTS

DE 195 27 026 2/1997

(Continued)

OTHER PUBLICATIONS

N. Goodman, R. Ignatius, L. Wharton, and R. Winston, "Solid-dielectric Compound Parabolic Concentrators: On Their Use with Photovoltaic Devices", Applied Optics, vol. 15, No. 10, pp. 2434-2436, 1976.

(Continued)

*Primary Examiner*—Laura Tso
(74) *Attorney, Agent, or Firm*—Scott A. Bardell

(57) ABSTRACT

The present application discloses a light source comprising an LED die having an emitting surface and an optical element including a base, an apex, the base, and a converging side joining the base and the apex, wherein the base is optically coupled to the emitting surface. Furthermore, the optical element comprises a first section including the base and that is composed of a first material and a second section including the apex and that is composed of a second material.

26 Claims, 6 Drawing Sheets

U.S. PATENT DOCUMENTS

| | | |
|---|---|---|
| 6,480,389 B1 | 11/2002 | Shie et al. |
| 6,483,196 B1 | 11/2002 | Wojnarowski et al. |
| 6,495,862 B1 | 12/2002 | Okazaki et al. |
| 6,501,091 B1 | 12/2002 | Bawendi et al. |
| 6,521,916 B2 | 2/2003 | Roberts et al. |
| 6,598,998 B2 | 7/2003 | West et al. |
| 6,607,286 B2 | 8/2003 | West et al. |
| 6,610,598 B2 | 8/2003 | Chen |
| 6,649,939 B1 | 11/2003 | Wirth |
| 6,679,321 B2 | 1/2004 | Jin |
| 6,679,621 B2 | 1/2004 | West et al. |
| 6,727,313 B2 | 4/2004 | Zhou et al. |
| 6,784,460 B2 | 8/2004 | Ng et al. |
| 6,819,486 B2 | 11/2004 | Ma et al. |
| 6,903,877 B2 | 6/2005 | Tsunetomo |
| 6,949,771 B2 | 9/2005 | Yoganandan et al. |
| 6,957,904 B2 | 10/2005 | Randall |
| 6,972,439 B1 | 12/2005 | Kim et al. |
| 6,976,779 B2 | 12/2005 | Ohtsuki et al. |
| 6,987,613 B2 | 1/2006 | Pocius et al. |
| 6,997,580 B2 | 2/2006 | Wong |
| 7,009,213 B2 | 3/2006 | Camras et al. |
| 7,026,659 B2 | 4/2006 | Slater, Jr. et al. |
| 7,064,355 B2 | 6/2006 | Camras et al. |
| 7,080,932 B2 | 7/2006 | Keuper |
| 7,192,795 B2 | 3/2007 | Boardman et al. |
| 7,210,793 B2 | 5/2007 | Yonekubo |
| 2001/0010371 A1 | 8/2001 | Carey et al. |
| 2002/0030194 A1 | 3/2002 | Camras et al. |
| 2002/0135298 A1 | 9/2002 | Pelka et al. |
| 2002/0163719 A1 | 11/2002 | Ma et al. |
| 2002/0165310 A1 | 11/2002 | Zhou et al. |
| 2003/0025449 A1 | 2/2003 | Rossner |
| 2004/0028328 A1 | 2/2004 | Tanaka et al. |
| 2004/0036080 A1 | 2/2004 | Bogner et al. |
| 2004/0041222 A1 | 3/2004 | Loh |
| 2004/0046179 A1 | 3/2004 | Baur et al. |
| 2004/0051106 A1 | 3/2004 | Baur et al. |
| 2004/0061120 A1 | 4/2004 | Mizuyoshi |
| 2004/0079942 A1 | 4/2004 | Steranka et al. |
| 2004/0150991 A1 | 8/2004 | Ouderkirk et al. |
| 2004/0164311 A1 | 8/2004 | Uemura |
| 2004/0184270 A1 | 9/2004 | Halter |
| 2004/0190304 A1 | 9/2004 | Sugimoto et al. |
| 2004/0246744 A1 | 12/2004 | Krupa et al. |
| 2005/0014303 A1 | 1/2005 | Tsai et al. |
| 2005/0023545 A1 | 2/2005 | Camras et al. |
| 2005/0093430 A1 | 5/2005 | Ibbetson et al. |
| 2005/0116235 A1 | 6/2005 | Schultz et al. |
| 2005/0117366 A1 | 6/2005 | Simbal |
| 2005/0151141 A1 | 7/2005 | Grotsch et al. |
| 2005/0173719 A1 | 8/2005 | Yonekubo et al. |
| 2005/0174771 A1 | 8/2005 | Conner |
| 2005/0213310 A1 | 9/2005 | Takeda |
| 2005/0243570 A1 | 11/2005 | Chaves et al. |
| 2005/0265029 A1 | 12/2005 | Epstein et al. |
| 2006/0034082 A1 | 2/2006 | Park et al. |
| 2006/0043402 A1 | 3/2006 | Suehiro et al. |
| 2006/0054904 A1 | 3/2006 | Lin et al. |
| 2006/0055843 A1 | 3/2006 | Hahm et al. |
| 2006/0067078 A1 | 3/2006 | Beeson et al. |
| 2006/0067079 A1 | 3/2006 | Noh et al. |
| 2006/0067640 A1 | 3/2006 | Hsieh et al. |
| 2006/0076568 A1 | 4/2006 | Keller et al. |
| 2006/0083000 A1 | 4/2006 | Yoon et al. |
| 2006/0091411 A1 | 5/2006 | Ouderkirk et al. |
| 2006/0091412 A1 | 5/2006 | Wheatley et al. |
| 2006/0091414 A1 | 5/2006 | Ouderkirk et al. |
| 2006/0091784 A1 | 5/2006 | Conner et al. |
| 2006/0091798 A1 | 5/2006 | Ouderkirk et al. |
| 2006/0092532 A1 | 5/2006 | Ouderkirk et al. |
| 2006/0094322 A1 | 5/2006 | Ouderkirk et al. |
| 2006/0094340 A1 | 5/2006 | Ouderkirk et al. |
| 2006/0102914 A1 | 5/2006 | Smits et al. |
| 2006/0105480 A1 | 5/2006 | Boardman et al. |
| 2006/0239006 A1 | 10/2006 | Chaves et al. |
| 2006/0239033 A1 | 10/2006 | Jung et al. |
| 2007/0018182 A1 | 1/2007 | Beeson et al. |
| 2007/0018184 A1 | 1/2007 | Beeson et al. |
| 2007/0116423 A1 | 5/2007 | Leatherdale et al. |

FOREIGN PATENT DOCUMENTS

| | | |
|---|---|---|
| EP | 1 119 058 | 7/2000 |
| EP | 1 213 773 | 6/2002 |
| EP | 1 396 754 | 3/2004 |
| EP | 1 467 238 | 10/2004 |
| EP | 1 503 434 | 2/2005 |
| EP | 1 566 847 | 8/2005 |
| EP | 1 581 010 | 9/2005 |
| GB | 1 409 793 | 10/1975 |
| GB | 2 340 301 | 7/1998 |
| GB | 2 373 368 | 9/2002 |
| GB | 2 378 576 | 2/2003 |
| JP | 59-225583 | 12/1984 |
| JP | 61127186 | 6/1986 |
| JP | 2003-006506 | 1/1991 |
| JP | 07007184 | 1/1995 |
| JP | 09-167515 | 6/1997 |
| JP | 2001036148 | 2/2001 |
| JP | 2001059922 | 3/2001 |
| WO | WO 00/69000 | 11/2000 |
| WO | WO 01/41219 | 6/2001 |
| WO | WO 01/41225 | 6/2001 |
| WO | WO 02/15281 | 2/2002 |
| WO | WO 02/077689 | 10/2002 |
| WO | WO 02/078055 | 10/2002 |
| WO | WO 03/069685 | 8/2003 |
| WO | WO 2004/040346 | 5/2004 |
| WO | WO 2004/043076 | 5/2004 |
| WO | WO 2004/068183 | 8/2004 |
| WO | WO 2004/068602 | 8/2004 |
| WO | WO 2004/068603 | 8/2004 |
| WO | WO 2004/070839 | 8/2004 |
| WO | WO 2004070839 | 8/2004 |
| WO | WO 2006/049801 | 5/2006 |
| WO | WO 2007/036829 | 4/2007 |

OTHER PUBLICATIONS

"The Emergence of LEDs—Luminance to Illumination" http://www.lumileds.com/pdfs/TP40_IESNA_July%202004_LED_Paper.pdf, last visited on Mar. 04, 2005.

Krames et al., "High-power truncated-inverted-pyramid ($Al_xGa_{1-x})_{0.5}In_{0.5}P$/GaP light-emitting diodes exhibiting >50% external quantum efficiency", Applied Physics Letters, vol. 75, No. 16, pp. 2365-2367, Oct. 18, 1999.

I. Schnitzer et al., "30% external quantum efficiency from surface textured, thin-film light-emitting diodes", Applied Physics Letters, vol. 63, No. 16, 2174-2176, 1993.

E. Schubert, "Light Emitting Diodes", Cambridge University Press, United Kingdom, pp. 114-154, 2003.

Scott, Keith, "IESNA 2004: From Concept to Reality to the Future", IESNA Great Lakes Region Education Fly-In, Lumileds Lighting, Jun. 2004, http://www.lumileds.com/pdfs/TP41_IESNA_Buffalo_6-04.pdf; last visited Feb. 7, 2005.

Teijido, Juan Manuel, "Optical design for LED base devices", pp. 1-15, Light Emitting Diodes 2003, Oct. 15-17, 2002.

U.S. Application entitled "LED Package with Wedge-shaped Optical Element", filed May 2, 2006, having U.S. Appl. No. 11/381,293.

U.S. Application entitled "LED Package with Converging Optical Element", filed May 2, 2006, having U.S. Appl. No. 11/381,324.

U.S. Application entitled "LED Package with Encapsulated Converging Optical Element", filed May 2, 2006, having U.S. Appl. No. 11/381,332.

U.S. Application entitled "LED Package with Non-bonded Converging Optical Element", filed May 2, 2006, having U.S. Appl. No. 11/381,334.

U.S. Application entitled "Arrays of Optical Elements and Method of Manufacturing Same", filed May 2, 2006, having U.S. Appl. No. 11/288,071.

West et al., "LED Backlight for Large Area LCD TV's", http://www.lumileds.com/solutions/LCD/Luxeon_Direct-SID_2003.pdf, last visited on Feb. 4, 2005.

West et al., "High Brightness Direct LED Backlight for LCD-TV", SID 03 Digest, ISSN/0003-0966X/03/3403-0694, 2003, http://www.lumileds.com/pdfs/techpaperspres/HiBrtDirLEDTV.PDF, Last visited on Feb. 4, 2005.

U.S. Appl. No. 60/807,565, Filed Jul. 17, 2006, Titled "LED Package with Converging Extractor".

U.S. Appl. No. 11/381,512, Filed May 3, 2006, Titled "Making LED Extractor Arrays".

Lee et al., "Analysis of Position-Dependent Light Extraction of GaN-Based LEDs", Optics Express, 2005, pp. 4175-4179, vol. 13, No. 11, Publisher: Optical Society of America.

Sun et al., "Enhancement of Light Extraction of GaN-Based Light-Emitting Diodes with a Microstructure Array", Optical Engineering, Aug. 2004, pp. 1700-1701, vol. 43, No. 8, Publisher: Society of Photo-Optical Instrumentation Engineers.

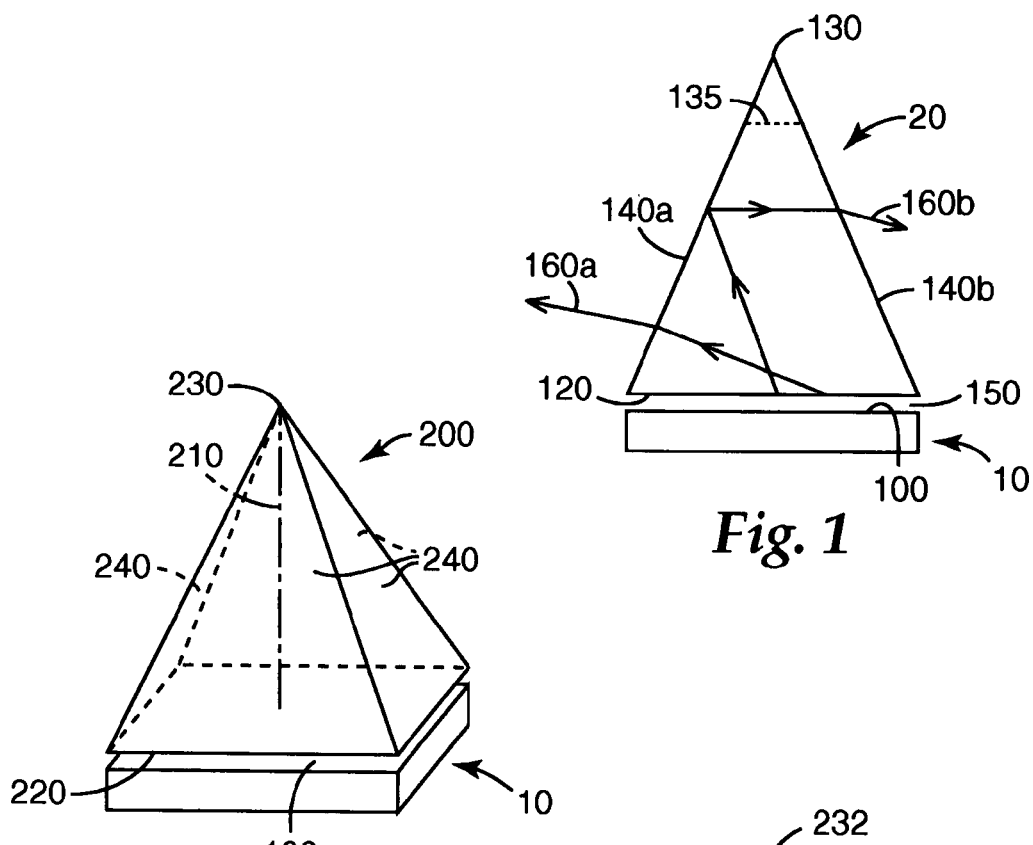
*Fig. 1*
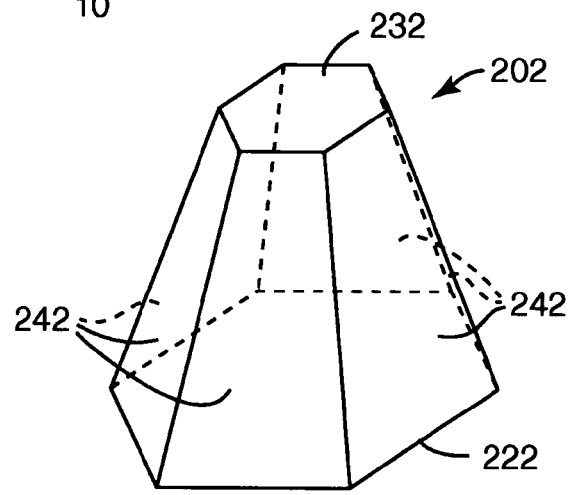
*Fig. 2a*
*Fig. 2b*
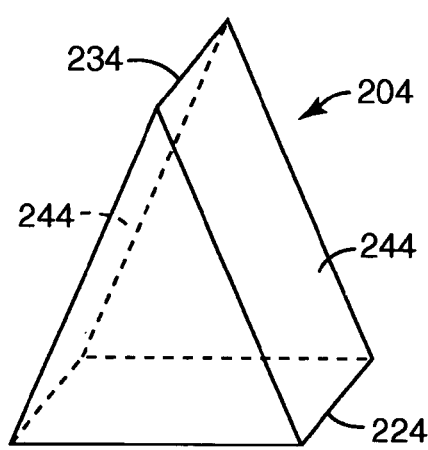
*Fig. 2c*

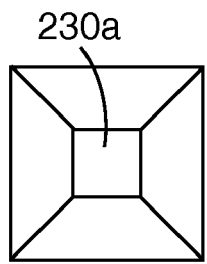
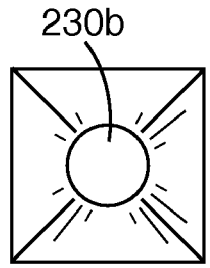
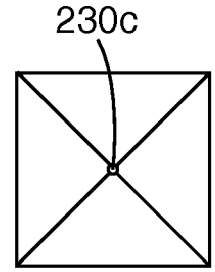
*Fig. 4a*  *Fig. 4b*  *Fig. 4c*
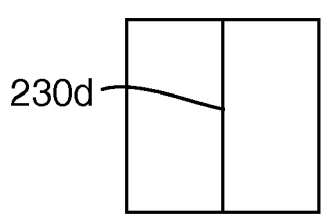
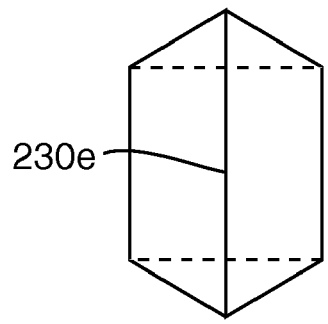
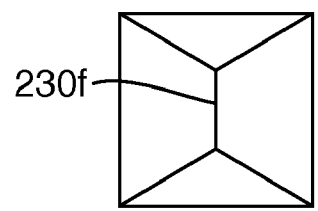
*Fig. 4d*  *Fig. 4e*  *Fig. 4f*
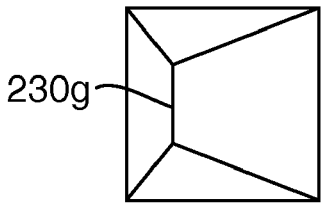
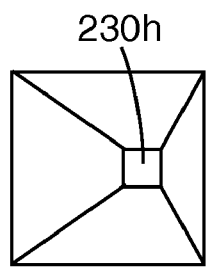
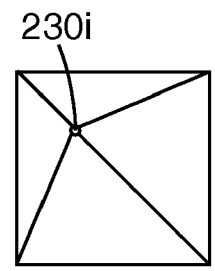
*Fig. 4g*  *Fig. 4h*  *Fig. 4i*

LED PACKAGE WITH COMPOUND CONVERGING OPTICAL ELEMENT

FIELD OF INVENTION

The present invention relates to light sources. More particularly, the present invention relates to light sources in which light emitted from a light emitting diode (LED) is extracted using an optical element.

BACKGROUND

LEDs have the inherent potential to provide the brightness, output, and operational lifetime that would compete with conventional light sources. Unfortunately, LEDs produce light in semiconductor materials, which have a high refractive index, thus making it difficult to efficiently extract light from the LED without substantially reducing brightness, or increasing the apparent emitting area of the LED. Because of a large refractive index mismatch between the semiconductor and air, an angle of an escape cone for the semiconductor-air interface is relatively small. Much of the light generated in the semiconductor is totally internally reflected and cannot escape the semiconductor thus reducing brightness.

Previous approaches of extracting light from LED dies have used epoxy or silicone encapsulants, in various shapes, e.g. a conformal domed structure over the LED die or formed within a reflector cup shaped around the LED die. Encapsulants have a higher index of refraction than air, which reduces the total internal reflection at the semiconductor-encapsulant interface thus enhancing extraction efficiency. Even with encapsulants, however, there still exists a significant refractive index mismatch between a semiconductor die (typical index of refraction, n of 2.5 or higher) and an epoxy encapsulant (typical n of 1.5).

Recently, it has been proposed to make an optical element separately and then bring it into contact or close proximity with a surface of an LED die to couple or "extract" light from the LED die. Such an element can be referred to as an extractor. Examples of such optical elements are described in U.S. Patent Application Publication No. US 2002/0030194A1, "LIGHT EMITTING DIODES WITH IMPROVED LIGHT EXTRACTION EFFICIENCY" (Camras et al.).

SUMMARY

The present application discloses a light source comprising an LED die having an emitting surface and an optical element including a base, an apex, the base, and a converging side joining the base and the apex, wherein the base is optically coupled to the emitting surface. Furthermore, the optical element comprises a first section including the base and that is composed of a first material and a second section including the apex and that is composed of a second material. The above summary of the present invention is not intended to describe each disclosed embodiment or every implementation of the present invention. The Figures and the detailed description below more particularly exemplify illustrative embodiments.

BRIEF DESCRIPTION OF THE DRAWINGS

The invention may be more completely understood in consideration of the following detailed description of various embodiments of the invention in connection with the accompanying drawings, where like reference numerals designate like elements. The appended drawings are intended to be illustrative examples and are not intended to be limiting. Sizes of various elements in the drawings are approximate and may not be to scale.

FIG. 1 is a schematic side view illustrating an optical element and LED die configuration in one embodiment.

FIGS. 2a-c are perspective views of an optical element according to additional embodiments.

FIGS. 4a-4i are top views of optical elements according to several alternative embodiments.

DETAILED DESCRIPTION

Figure 3:
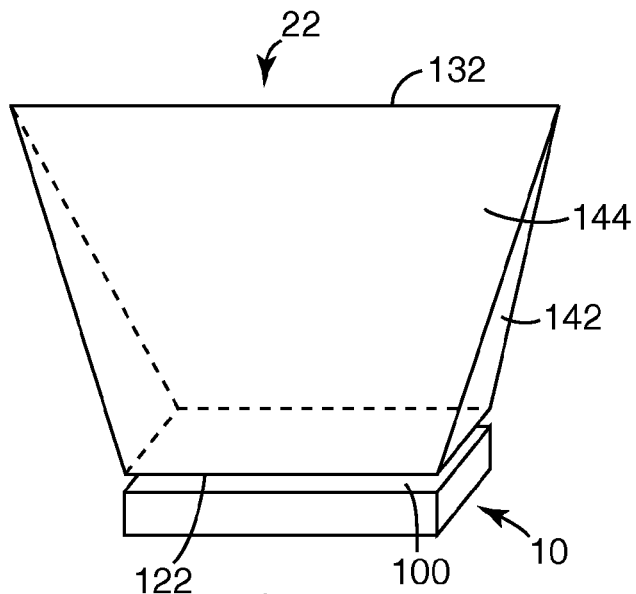
FIG. 3 is a perspective view of an optical element according to another embodiment.

Recently, it has been proposed to make optical elements to more efficiently "extract" light from an LED die. Extracting optical elements are made separately and then brought into contact or close proximity with a surface of the LED die. Such optical elements can be referred to as extractors. Most of the applications utilizing optical elements such as these have shaped the optical elements to extract the light out of the LED die and to emit it in a generally forward direction. Some shapes of optical elements can also collimate light. These are known as "optical concentrators." See e.g. U.S. Patent Application Publication No. US 2002/0030194A1, "LIGHT EMITTING DIODES WITH IMPROVED LIGHT EXTRACTION EFFICIENCY" (Camras et al.); U.S. patent application Ser. No. 10/977,577, "HIGH BRIGHTNESS LED PACKAGE"; and U.S. patent application Ser. No. 10/977,249, titled "LED PACKAGE WITH NON-BONDED OPTICAL ELEMENT".

Side emitting optical elements have also been proposed. See U.S. Pat. No. 7,009,213 titled "LIGHT EMITTING DEVICES WITH IMPROVED LIGHT EXTRACTION EFFICIENCY" (Camras et al.; hereinafter "Camras et al. '213"). The side-emitters described in Camras et al. '213 rely on mirrors to redirect the light to the sides.

The present application discloses optical elements that are shaped to redirect light to the sides without the need for mirrors or other reflective layers. Applicants found that particular shapes of optical elements can be useful in redirecting the light to the sides due to their shape, thus eliminating the need for additional reflective layers or mirrors. Such optical elements generally have at least one converging side, as described below. The converging side serves as a reflective surface for light incident at high angles because the light is totally internally reflected at the interface of the optical element (preferably high refractive index) and the surrounding medium (e.g. air, lower refractive index).

Eliminating mirrors improves the manufacturing process and reduces costs. Furthermore, optical elements having converging shapes use less material thus providing additional cost savings, since materials used for optical elements can be very expensive.

It is desirable in some situations to form the optical element from high refractive index materials to reduce reflections at the LED emitting surface over the base of the optical element, so that light is more efficiently coupled out of, or extracted from, the LED die. It can also be desirable to fabricate the optical element using a material having high thermal conductivity and high thermal stability. In this way, the optical element can perform not only an optical function but a thermal management function as well.

Unfortunately, transparent materials that have sufficiently high refractive indices at the LED emission wavelength, e.g., greater than about 1.8, 2.0, or even 2.5, and/or that have thermal conductivities greater than about 0.2 W/cm/K, tend to be expensive and/or difficult to fabricate. Some of the relatively few materials that have both high refractive index and high thermal conductivity include diamond, silicon carbide (SiC), and sapphire ($Al_2O_3$). These inorganic materials are expensive, physically very hard, and difficult to shape and polish to an optical grade finish.

The present application discloses light sources having optical elements for efficiently extracting light out of LED dies and for modifying the angular distribution of the emitted light. Each optical element is optically coupled to the emitting surface of an LED die (or LED die array) to efficiently extract light and to modify the emission pattern of the emitted light. LED sources that include optical elements can be useful in a variety of applications, including, for example, backlights in liquid crystal displays or backlit signs.

Light sources comprising converging optical elements described herein can be suited for use in backlights, both edge-lit and direct-lit constructions. Wedge-shaped optical elements are particularly suited for edge-lit backlights, where the light source is disposed along an outer portion of the backlight. Pyramid or cone-shaped converging optical elements can be particularly suited for use in direct-lit backlights. Such light sources can be used as single light source elements, or can be arranged in an array, depending on the particular backlight design.

For a direct-lit backlight, the light sources are generally disposed between a diffuse or specular reflector and an upper film stack that can include prism films, diffusers, and reflective polarizers. These can be used to direct the light emitted from the light source towards the viewer with the most useful range of viewing angles and with uniform brightness. Exemplary prism films include brightness enhancement films such as BEF™ available from 3M Company, St. Paul, Minn. Exemplary reflective polarizers include DBEF™ also available from 3M Company, St. Paul, Minn. For an edge-lit backlight, the light source can be positioned to inject light into a hollow or solid light guide. The light guide generally has a reflector below it and an upper film stack as described above.

FIG. 1 is a schematic side view illustrating a light source according to one embodiment. The light source comprises an optical element 20 and an LED die 10. The optical element 20 has a triangular cross-section with a base 120 and two converging sides 140 joined opposite the base 120 to form an apex 130. The apex can be a point, as shown at 130 in FIG. 1, or can be blunted, as for example in a truncated triangle (shown by dotted line 135). A blunted apex can be flat, rounded, or a combination thereof. The apex is smaller than the base and preferably resides over the base. In some embodiments, the apex is no more than 20% of the size of the base. Preferably, the apex is no more than 10% of the size of the base. In FIG. 1, the apex 130 is centered over the base 120. However, embodiments where the apex is not centered or is skewed away from the center of the base are also contemplated.

The optical element 20 is optically coupled to the LED die 10 to extract light emitted by the LED die 10. The primary emitting surface 100 of the LED die 10 is substantially parallel and in close proximity to the base 120 of the optical element 20. The LED die 10 and optical element 20 can be optically coupled in a number of ways including bonded and non-bonded configurations, which are described in more detail below.

The converging sides 140a-b of the optical element 20 act to modify the emission pattern of light emitted by the LED die 10, as shown by the arrows 160a-b in FIG. 1. A typical bare LED die emits light in a first emission pattern. Typically, the first emission pattern is generally forward emitting or has a substantial forward emitting component. A converging optical element, such as optical element 20 depicted in FIG. 1, modifies the first emission pattern into a second, different emission pattern. For example, a wedge-shaped optical element directs light emitted by the LED die to produce a side emitting pattern having two lobes. FIG. 1 shows exemplary light rays 160a-b emitted by the LED die entering the optical element 20 at the base. A light ray emitted in a direction forming a relatively low incidence angle with the converging side 140a will be refracted as it exits the high index material of the optical element 20 into the surrounding medium (e.g. air). Exemplary light ray 160a shows one such light ray, incident at a small angle with respect to normal. A different light ray, emitted at a high incidence angle, an angle greater than or equal to the critical angle, will be totally internally reflected at the first converging side it encounters (140a). However, in a converging optical element such as the one illustrated in FIG. 1, the reflected ray will subsequently encounter the second converging side (140b) at a low incidence angle, where it will be refracted and allowed to exit the optical element. An exemplary light ray 160b illustrates one such light path.

An optical element having at least one converging side can modify a first light emission pattern into a second, different light emission pattern. For example, a generally forward emitting light pattern can be modified into a second, generally side-emitting light pattern with such a converging optical element. In other words, a high index optical element can be shaped to direct light emitted by the LED die to produce a side emitting pattern. If the optical element is rotationally symmetric (e.g. shaped as a cone) the resulting light emission pattern will have a torroidal distribution—the intensity of the emitted light will be concentrated in a circular pattern around the optical element. If, for example, an optical element is shaped as a wedge (e.g. see FIG. 3) the side emitting pattern will have two lobes—the light intensity will be concentrated in two zones. In case of a symmetric wedge, the two lobes will be located on opposing sides of the optical element (two opposing zones). For optical elements having a plurality of converging sides, the side emitting pattern will have a corresponding plurality of lobes. For example, for an optical element shaped as a four-sided pyramid, the resulting side emitting pattern will have four lobes. The side emitting pattern can be symmetric or asymmetric. An asymmetric pattern will be produced when the apex of the optical element is placed asymmetrically with respect to the base or emission surface. Those skilled in the art will appreciate the various permutations of such arrangements and shapes to produce a variety of different emission patterns, as desired.

In some embodiments, the side emitting pattern has an intensity distribution with a maximum at a polar angle of at least 30°, as measured in an intensity line plot. In other embodiments the side emitting pattern has an intensity distribution centered at a polar angle of at least 30°. Other intensity distributions are also possible with presently disclosed optical elements, including, for example those having maxima and/or centered at 45° and 60° polar angle.

Converging optical elements can have a variety of forms. Each optical element has a base, an apex, and at least one converging side. The base can have any shape (e.g. square, circular, symmetrical or non-symmetrical, regular or irregular). The apex can be a point, a line, or a surface (in case of a blunted apex). Regardless of the particular converging shape, the apex is smaller in surface area than the base, so that the side(s) converge from the base towards the apex. A converging optical element can be shaped as a pyramid, a cone, a wedge, or a combination thereof. Each of these shapes can also be truncated near the apex, forming a blunted apex. A converging optical element can have a polyhedral shape, with a polygonal base and at least two converging sides. For example, a pyramid or wedge-shaped optical element can have a rectangular or square base and four sides wherein at least two of the sides are converging sides. The other sides can be parallel sides, or alternatively can be diverging or converging. The shape of the base need not be symmetrical and can be shaped, for example, as a trapezoid, parallelogram, quadrilateral, or other polygon. In other embodiments, a converging optical element can have a circular, elliptical, or an irregularly-shaped but continuous base. In these embodiments, the optical element can be said to have a single converging side. For example, an optical element having a circular base can be shaped as a cone. Generally, a converging optical element comprises a base, an apex residing (at least partially) over the base, and one or more converging sides joining the apex and the base to complete the solid.

FIG. 2a shows one embodiment of a converging optical element 200 shaped as a four-sided pyramid having a base 220, an apex 230, and four sides 240. In this particular embodiment, the base 220 can be rectangular or square and the apex 230 is centered over the base (a projection of the apex in a line 210 perpendicular to the plane of the base is centered over the base 220). FIG. 2a also shows an LED die 10 having an emitting surface 100 which is proximate and parallel to the base 220 of the optical element 200. The LED die 10 and optical element 200 are optically coupled at the emitting surface—base interface. Optical coupling can be achieved in several ways, described in more detail below. For example, the LED die and optical element can be bonded together. In FIG. 2a the base and the emitting surface of the LED die are shown as substantially matched in size. In other embodiments, the base can be larger or smaller than the LED die emitting surface.

FIG. 2b shows another embodiment of a converging optical element 202. Here, optical element 202 has a hexagonal base 222, a blunted apex 232, and six sides 242. The sides extend between the base and the apex and each side converges towards the apex 232. The apex 232 is blunted and forms a surface also shaped as a hexagon, but smaller than the hexagonal base.

FIG. 2c shows another embodiment of an optical element 204 having two converging sides 244, a base 224, and an apex 234. In FIG. 2c, the optical element is shaped as a wedge and the apex 234 forms a line. The other two sides are shown as parallel sides. Viewed from the top, the optical element 204 is depicted in FIG. 4d.

Alternative embodiments of wedge-shaped optical elements also include shapes having a combination of converging and diverging sides, such as the optical element 22 shown in FIG. 3. In the embodiment shown in FIG. 3, the wedge-shaped optical element 22 resembles an axe-head. The two diverging sides 142 act to collimate the light emitted by the LED die. The two converging sides 144 converge at the top forming an apex 132 shaped as a line residing over the base when viewed from the side (see FIG. 1), but having portions extending beyond the base 122 when viewed as shown in FIG. 3 (or FIG. 4e). The converging sides 144 allow the light emitted by the LED die 10 to be redirected to the sides, as shown in FIG. 1. Other embodiments include wedge shapes where all sides converge, for example as shown in FIG. 4f.

The optical element can also be shaped as a cone having a circular or elliptical base, an apex residing (at least partially) over the base, and a single converging side joining the base and the apex. As in the pyramid and wedge shapes described above, the apex can be a point, a line (straight or curved) or it can be blunted forming a surface.

FIGS. 4a-4i show top views of several alternative embodiments of an optical element. FIGS. 4a-4f show embodiments in which the apex is centered over the base. FIGS. 4g-4i show embodiments of asymmetrical optical elements in which the apex is skewed or tilted and is not centered over the base.

FIG. 4a shows a pyramid-shaped optical element having a square base, four sides, and a blunted apex 230a centered over the base. FIG. 4h shows a pyramid-shaped optical element having a square base, four sides, and a blunted apex 230h that is off-center. FIG. 4b shows an embodiment of an optical element having a square base and a blunted apex 230b shaped as a circle. In this case, the converging sides are curved such that the square base is joined with the circular apex. FIG. 4c shows a pyramid-shaped optical element having a square base, four triangular sides converging at a point to form an apex 230c, which is centered over the base. FIG. 4i shows a pyramid-shaped optical element having a square base, four triangular sides converging at a point to form an apex 230i, which is skewed (not centered) over the base.

FIGS. 4d-4g show wedge-shaped optical elements. In FIG. 4d, the apex 230d forms a line residing and centered over the base. In FIG. 4e, the apex 230e forms a line that is centered over the base and partially resides over the base. The apex 230e also has portions extending beyond the base. The top view depicted in FIG. 4e can be a top view of the optical element shown perspective in FIG. 3 and described above. FIG. 4f and FIG. 4g show two alternative embodiments of a wedge-shaped optical element having an apex forming a line and four converging sides. In FIG. 4f, the apex 230f is centered over the base, while in FIG. 4g, the apex 230g is skewed.

Figure 5A:
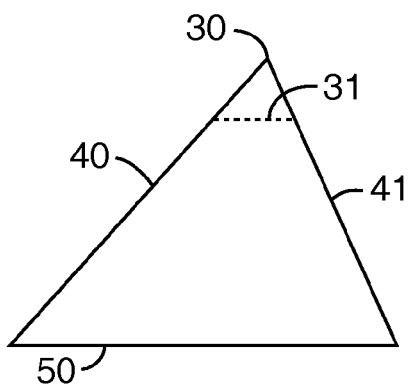
FIGS. 5a-c are schematic front views illustrating optical elements in alternative embodiments.
Figure 5B:
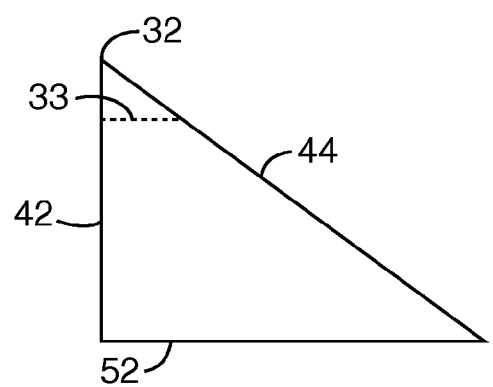
Figure 5C:
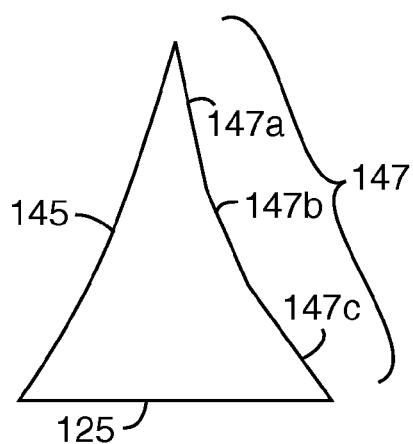

FIGS. 5a-5c show side views of an optical element according to alternative embodiments. FIG. 5a shows one embodiment of an optical element having a base 50 and sides 40 and 41 starting at the base 50 and converging towards an apex 30 residing over the base 50. Optionally, the sides can converge toward a blunted apex 31. FIG. 5b shows another embodiment of an optical element having a base 52, a converging side 44 and a side 42 perpendicular to the base. The two sides 42 and 44 form an apex 32 residing over the edge of the base. Optionally, the apex can be a blunted apex 33. FIG. 5c shows a side view of an alternative optical element having a generally triangular cross section. Here, the base 125 and the sides 145 and 147 generally form a triangle, but the sides 145 and 147 are non-planar surfaces. In FIG. 5c the optical element has a left side 145 that is curved and a right side that is faceted (i.e. it is a combination of three smaller flat portions 147a-c). The sides can be curved, segmented, faceted, convex, concave, or a combination thereof. Such forms of the sides still function to modify the angular emission of the light extracted similarly to the planar or flat sides described above, but offer an added degree of customization of the final light emission pattern.

Figure 6A:
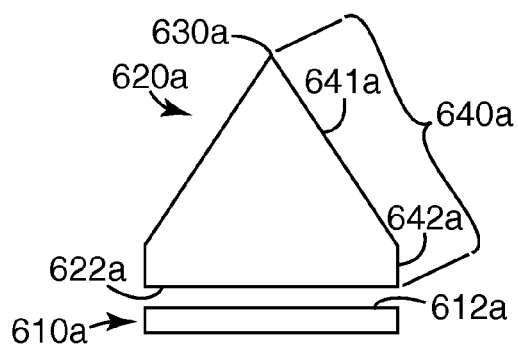
FIGS. 6a-e are schematic side views of optical elements and LED dies according to several alternative embodiments.
Figure 6B:
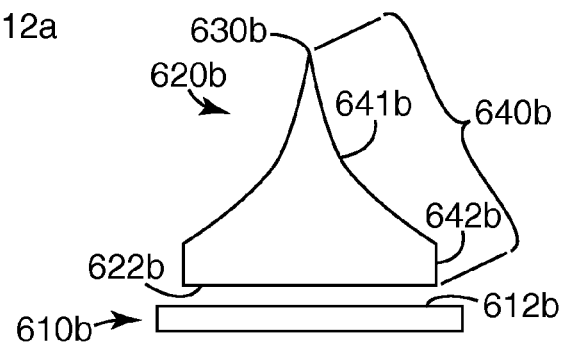
Figure 6C:
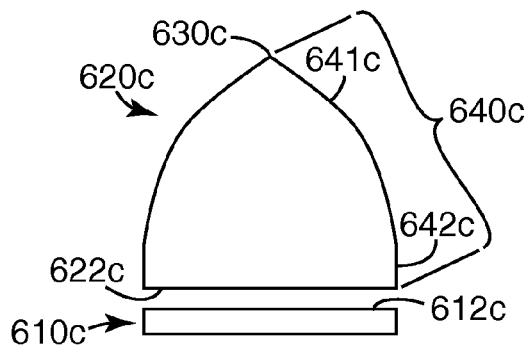
Figure 6D:
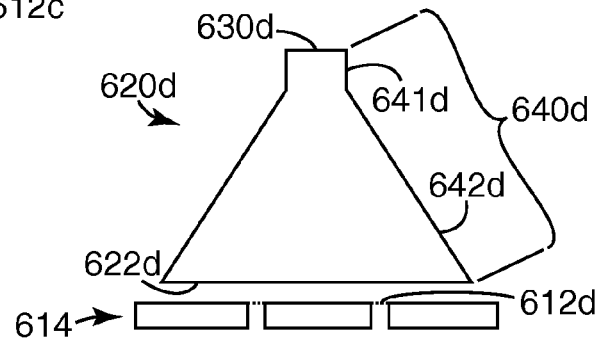
Figure 6E:
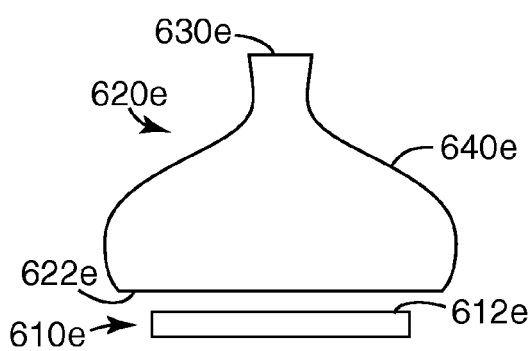

FIGS. 6a-6e depict alternative embodiments of optical elements 620a-e having non-planar sides 640a-e extending between each base 622a-e and apex 630a-e, respectively. In FIG. 6a, the optical element 620a has sides 640a comprising two faceted portions 641a and 642a. The portion 642a near the base 622a is perpendicular to the base 622a while the portion 641a converges toward the apex 630a. Similarly, in FIGS. 6b-c, the optical elements 620b-c have sides 640b-c formed by joining two portions 641b-c and 642b-c, respectively. In FIG. 6b, the converging portion 641b is concave. In FIG. 6c, the converging portion 641c is convex. FIG. 6d shows an optical element 620d having two sides 640d formed by joining portions 641d and 642d. Here, the portion 642d near the base 622d converges toward the blunted apex 630d and the top-most portion 641d is perpendicular to the surface of the blunted apex 630d. FIG. 6e shows an alternative embodiment of an optical element 620e having curved sides 640e. Here, the sides 640e are s-shaped, but generally converge towards the blunted apex 630e. When the sides are formed of two or more portions, as in FIGS. 6a-e, preferably the portions are arranged so that the side is still generally converging, even though it may have portions which are non-converging.

Figure 7A:
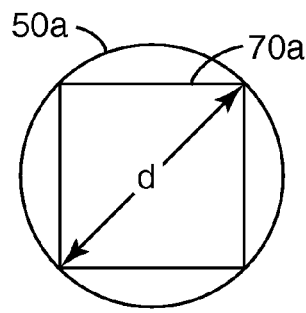
FIGS. 7a-d are bottom views of optical elements and LED dies according to several embodiments.
Figure 7B:
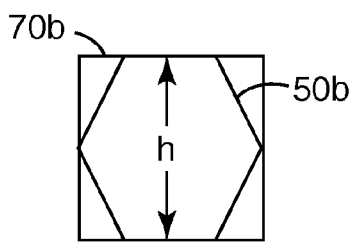
Figure 7C:
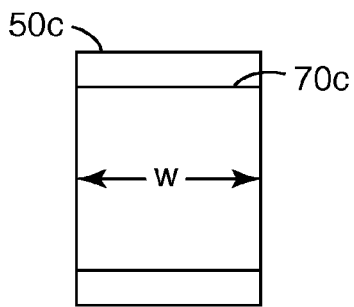
Figure 7D:
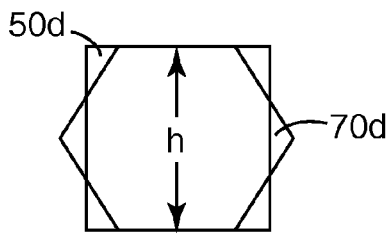

Preferably, the size of the base is matched to the size of the LED die at the emitting surface. FIGS. 7a-7d show exemplary embodiments of such arrangements. In FIG. 7a an optical element having a circular base 50a is optically coupled to an LED die having a square emitting surface 70a. Here, the base and emitting surface are matched by having the diameter "d" of the circular base 50a equal to the diagonal dimension (also "d") of the square emitting surface 70a. In FIG. 7b, an optical element having a hexagonal base 50b is optically coupled to an LED die having a square emitting surface 70b. Here, the height "h" of the hexagonal base 50b matches the height "h" of the square emitting surface 70b. In FIG. 7c, an optical element having a rectangular base 50c is optically coupled to an LED die having a square emitting surface 70c. Here, the width "w" of both the base and the emitting surface are matched. In FIG. 7d, an optical element having a square base 50d is optically coupled to an LED die having a hexagonal emitting surface 70d. Here, the height "h" of both the base and the emitting surface are matched. Of course, a simple arrangement, in which both the base and emitting surface are identically shaped and have the same surface area, also meets this criteria. Here, the surface area of the base is matched to the surface area of the emitting surface of the LED die.

Similarly, when an optical element is coupled to an array of LED dies, the size of the array at the emitting surface side preferably can be matched to the size of the base of the optical element. Again, the shape of the array need not match the shape of the base, as long as they are matched in at least one dimension (e.g. diameter, width, height, or surface area).

Alternatively, the size of the LED die at the emitting surface or the combined size of the LED die array can be smaller or larger than the size of the base. FIGS. 6a and 6c show embodiments in which the emitting surface (612a and 612c, respectively) of the LED die (610a and 610c, respectively) is matched to the size of the base (622a and 622c, respectively). FIG. 6b shows an LED die 610b having an emitting surface 612b that is larger than the base 622b. FIG. 6d shows an array 614 of LED dies, the array 614 having a combined size at the emitting surface 612d that is larger than the size of the base 622d. FIG. 6e shows an LED die 610e having an emitting surface 612e that is smaller than the base 622e.

For example, if the LED die emitting surface is a square having sides of 1 mm, the optical element base can be made having a matching square having a 1 mm side. Alternatively, a square emitting surface could be optically coupled to a rectangular base, the rectangle having one of its sides matched in size to the size of the emitting surface side. The non-matched side of the rectangle can be larger or smaller than the side of the square. Optionally, an optical element can be made having a circular base having a diameter equal to the diagonal dimension of the emitting surface. For example, for a 1 mm by 1 mm square emitting surface a circular base having a diameter of 1.41 mm would be considered matched in size for the purpose of this application. The size of the base can also be made slightly smaller than the size of the emitting surface. This can have advantages if one of the goals is to minimize the apparent size of the light source, as described in commonly owned U.S. patent application titled "High Brightness LED Package", Ser. No. 10/977,577.

Figure 8:
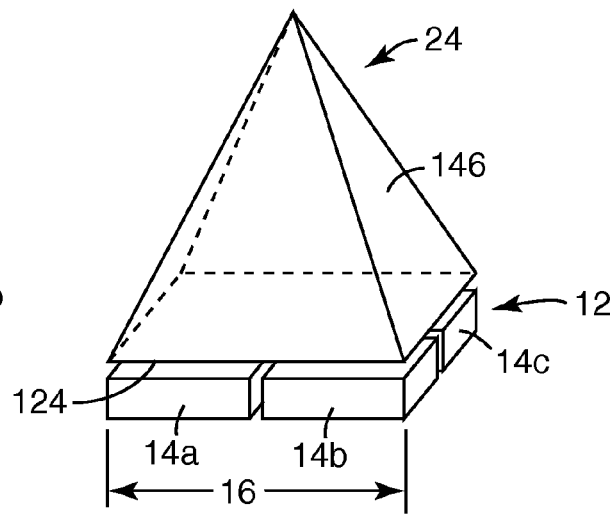
FIG. 8 is a perspective view of an optical element and an LED die array according to another embodiment.

FIG. 8 shows another embodiment of a light source comprising a converging optical element 24 optically coupled to a plurality of LED dies 14a-c arranged in an array 12. This arrangement can be particularly useful when red, green, and blue LEDs are combined in the array to produce white light when mixed. In FIG. 8, the optical element 24 has converging sides 146 to redirect light to the sides. The optical element 24 has a base 124 shaped as a square, which is optically coupled to the array of LED dies 12. The array of LED dies 12 also forms a square shape (having sides 16).

Optical elements disclosed herein can be manufactured by conventional means or by using precision abrasive techniques disclosed in commonly assigned U.S. patent application Ser. No. 10/977,239, titled "PROCESS FOR MANUFACTURING OPTICAL AND SEMICONDUCTOR ELEMENTS", U.S. patent application Ser. No. 10/977,240, titled "PROCESS FOR MANUFACTURING A LIGHT EMITTING ARRAY", and U.S. patent application Ser. No. 11/288,071, titled "ARRAYS OF OPTICAL ELEMENTS AND METHOD OF MANUFACTURING SAME".

The optical element is transparent and preferably has a relatively high refractive index. Suitable materials for the optical element include without limitation inorganic materials such as high index glasses (e.g. Schott glass type LASF35, available from Schott North America, Inc., Elmsford, N.Y. under a trade name LASF35) and ceramics (e.g. sapphire, zinc oxide, zirconia, diamond, and silicon carbide). Sapphire, zinc oxide, diamond, and silicon carbide are particularly useful since these materials also have a relatively high thermal conductivity (0.2-5.0 W/cm K). High index polymers or nanoparticle filled polymers are also contemplated. Suitable polymers can be both thermoplastic and thermosetting polymers. Thermoplastic polymers can include polycarbonate and cyclic olefin copolymer. Thermosetting polymers can be for example acrylics, epoxy, silicones and others known in the art. Suitable ceramic nanoparticles include zirconia, titania, zinc oxide, and zinc sulfide.

The index of refraction of the optical element ($n_o$) is preferably similar to the index of LED die emitting surface ($n_e$). Preferably, the difference between the two is no greater than 0.2 ($|n_o - n_e| \leq 0.2$). Optionally, the difference can be greater than 0.2, depending on the materials used. For example, the emitting surface can have an index of refraction of 1.75. A suitable optical element can have an index of refraction equal to or greater than 1.75 ($n_o \geq 1.75$), including for example $n_o \geq 1.9$, $n_o \geq 2.1$, and $n_o \geq 2.3$. Optionally, $n_o$ can be lower than $n_e$ (e.g. $n_o \geq 1.7$). Preferably, the index of refraction of the optical element is matched to the index of refraction of the primary emitting surface. In some embodiments, the indexes of refraction of both the optical element and the emitting surface can be the same in value ($n_o = n_e$). For example, a sapphire emitting surface having $n_e = 1.76$ can be matched with a sapphire optical element, or a glass optical element of SF4 (available from Schott North America, Inc., Elmsford, N.Y. under a trade name SF4) $n_o$=1.76. In other embodiments, the index of refraction of the optical element can be higher or lower than the index of refraction of the emitting surface. When made of high index materials, optical elements increase light extraction from the LED die due to their high refractive index and modify the emission distribution of light due to their shape, thus providing a tailored light emission pattern.

Throughout this disclosure, the LED die 10 is depicted generically for simplicity, but can include conventional design features as known in the art. For example, the LED die can include distinct p- and n-doped semiconductor layers, buffer layers, substrate layers, and superstrate layers. A simple rectangular LED die arrangement is shown, but other known configurations are also contemplated, e.g., angled side surfaces forming a truncated inverted pyramid LED die shape. Electrical contacts to the LED die are also not shown for simplicity, but can be provided on any of the surfaces of the die as is known. In exemplary embodiments the LED die has two contacts both disposed at the bottom surface in a "flip chip" design. The present disclosure is not intended to limit the shape of the optical element or the shape of the LED die, but merely provides illustrative examples.

An optical element is considered optically coupled to an LED die, when the minimum gap between the optical element and emitting surface of the LED die is no greater than the evanescent wave. Optical coupling can be achieved by placing the LED die and the optical element physically close together. FIG. 1 shows a gap 150 between the emitting surface 100 of the LED die 10 and the base 120 of optical element 20. Typically, the gap 150 is an air gap and is typically very small to promote frustrated total internal reflection. For example, in FIG. 1, the base 120 of the optical element 20 is optically close to the emitting surface 100 of the LED die 10, if the gap 150 is on the order of the wavelength of light in air. Preferably, the thickness of the gap 150 is less than a wavelength of light in air. In LEDs where multiple wavelengths of light are used, the gap 150 is preferably at most the value of the longest wavelength. Suitable gap sizes include 25 nm, 50 nm, and 100 nm. Preferably, the gap is minimized, such as when the LED die and the input aperture or base of the optical element are polished to optical flatness and wafer bonded together.

In addition, it is preferred that the gap 150 be substantially uniform over the area of contact between the emitting surface 100 and the base 120, and that the emitting surface 100 and the base 120 have a roughness of less than 20 nm, preferably less than 5 nm. In such configurations, a light ray emitted from LED die 10 outside the escape cone or at an angle that would normally be totally internally reflected at the LED die-air interface will instead be transmitted into the optical element 20. To promote optical coupling, the surface of the base 120 can be shaped to match the emitting surface 100. For example, if the emitting surface 100 of LED die 10 is flat, as shown in FIG. 1, the base 120 of optical element 20 can also be flat. Alternatively, if the emitting surface of the LED die is curved (e.g. slightly concave) the base of the optical element can be shaped to mate with the emitting surface (e.g. slightly convex). The size of the base 120 may either be smaller, equal, or larger than LED die emitting surface 100. The base 120 can be the same or different in cross sectional shape than LED die 10. For example, the LED die can have a square emitting surface while the optical element has a circular base. Other variations will be apparent to those skilled in the art.

Figure 9:
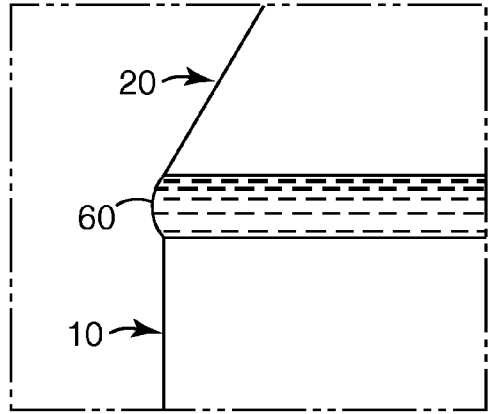
FIG. 9 is partial view of an optical element and an LED die according to another embodiment.

Suitable gap sizes include 100 nm, 50 nm, and 25 nm. Preferably, the gap is minimized, such as when the LED die and the input aperture or base of the optical element are polished to optical flatness and wafer bonded together. The optical element and LED die can be bonded together by applying high temperature and pressure to provide an optically coupled arrangement. Any known wafer bonding technique can be used. Exemplary wafer bonding techniques are described in U.S. patent application Ser. No. 10/977,239, titled "Process for Manufacturing Optical and Semiconductor Elements". In case of a finite gap, optical coupling can be achieved or enhanced by adding a thin optically conducting layer between the emitting surface of the LED die and the base of the optical element. FIG. 9 shows a partial schematic side view of an optical element and LED die, such as that shown in FIG. 1, but with a thin optically conducting layer 60 disposed within the gap 150. Like the gap 150, the optically conducting layer 60 can be 100 nm, 50 nm, 25 nm in thickness or less. Preferably, the refractive index of the optically coupling layer is closely matched to the refractive index of the emission surface or the optical element. An optically conducting layer can be used in both bonded and non-bonded (mechanically decoupled) configurations. In bonded embodiments, the optically conducting layer can be any suitable bonding agent that transmits light, including, for example, a transparent adhesive layer, inorganic thin films, fusable glass frit or other similar bonding agents. Additional examples of bonded configurations are described, for example, in U.S. Patent Publication No. U.S. 2002/0030194 titled "Light Emitting Diodes with Improved Light Extraction Efficiency" (Camras et al.) published on Mar. 14, 2002.

In non-bonded embodiments, an LED die can be optically coupled to the optical element without use of any adhesives or other bonding agents between the LED die and the optical element. Non-bonded embodiments allow both the LED die and the optical element to be mechanically decoupled and allowed to move independently of each other. For example, the optical element can move laterally with respect to the LED die. In another example both the optical element and the LED die are free to expand as each component becomes heated during operation. In such mechanically decoupled systems the majority of stress forces, either sheer or normal, generated by expansion are not transmitted from one component to another component. In other words, movement of one component does not mechanically affect other components. This configuration can be particularly desirable where the light emitting material is fragile, where there is a coefficient of expansion mismatch between the LED die and the optical element, and where the LED is being repeatedly turned on and off.

Mechanically decoupled configurations can be made by placing the optical element optically close to the LED die (with only a very small air gap between the two). The air gap should be small enough to promote frustrated total internal reflection, as described above.

Alternatively, as shown in FIG. 9, a thin optically conducting layer 60 (e.g. an index matching fluid) can be added in the gap 150 between the optical element 20 and the LED die 10, provided that the optically conducting layer allows the optical element and LED die to move independently. Examples of materials suitable for the optically conducting layer 60 include index matching oils, and other liquids or gels with similar optical properties. Optionally, optically conducting layer 60 can also be thermally conducting.

The optical element and LED die can be encapsulated together using any of the known encapsulant materials, to make a final LED package or light source. Encapsulating the optical element and LED die provides a way to hold them together in the non-bonded embodiments.

Additional non-bonded configurations are described in commonly owned U.S. patent application Ser. No. 10/977,249, titled "LED Package with Non-bonded Optical Element".

The optical element can be made from a single structure, for example cut from a single block of material, or can be made by joining two or more sections together in a compound construction.

A first section desirably makes optical contact with the LED die, and is made of a first optical material having a high refractive index (preferably about equal to the LED die refractive index at the emitting surface), and optionally high thermal conductivity, and/or high thermal stability. In this regard, high thermal stability refers to materials having a decomposition temperature of about 600° C. or more. The thickness of the first section is preferably optically thick (e.g. effectively at least 5 microns, or 10 times the wavelength of light).

Silicon carbide is also electrically conductive, and as such may also provide an electrical contact or circuit function. Scattering within optical elements may be acceptable if the scattering is limited to a position near the input end or base of the optical element. However, it would be expensive and time consuming to make an optical element with sufficient length to efficiently couple light from an LED die. An additional challenge in making one-piece optical elements is that the material yield may be relatively low, and the form-factor may force the LED die to be individually assembled with the optical element. For these reasons, it can be advantageous to divide the optical element into two (or more) sections, the sections being made of different optical materials, to reduce manufacturing cost.

A second section is joined to the first section and is made of a second optical material, which may have lower material costs and be more easily fabricated than the first optical material. The second optical material may have a lower refractive index, lower thermal conductivity, or both relative to the first optical material. For example, the second optical material can comprise glasses, polymers, ceramics, ceramic nanoparticle-filled polymers, and other optically clear materials. Suitable glasses include those comprising oxides of lead, zirconium, titanium, and barium. The glasses can be made from compounds including titanates, zirconates, and stannates. Suitable ceramic nanoparticles include zirconia, titania, zinc oxide, and zinc sulfide.

Optionally, a third section composed of a third optical material can be joined to the second section to further aid in coupling the LED light to the outside environment. In one embodiment the refractive indices of the three sections are arranged such that $n_1 > n_2 > n_3$ to minimize overall Fresnel surface reflections associated with the optical element.

Figure 10A:
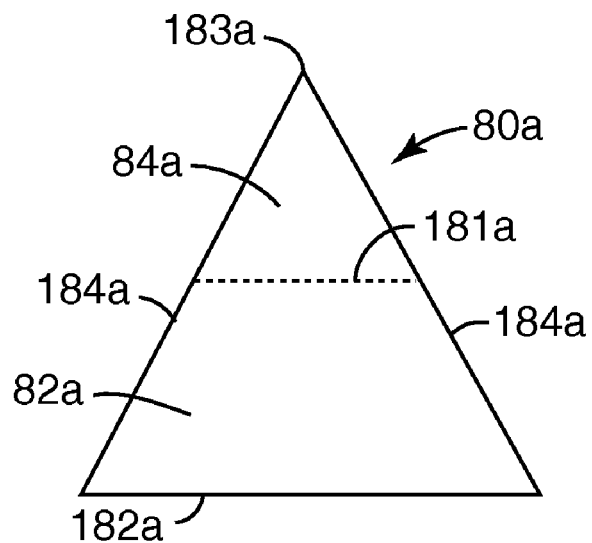
FIGS. 10a-b are perspective views of optical elements according to other embodiments.

FIG. 10a shows a front view of an exemplary compound optical element 80a according to one embodiment. The optical element 80a includes a base 182a, an apex 183a, and converging sides 184a, arranged as described elsewhere herein. In this embodiment, the optical element 80a comprises a first section 82a and a second section 84a. The first section includes the base 182a and is composed of a first material. The second section 84a includes the apex 183a and is composed of a second material. At the interface of the first and second sections, the blunted apex of the first section 82a is joined with the base of the second section 84a (shown as element 181a).

Figure 10B:
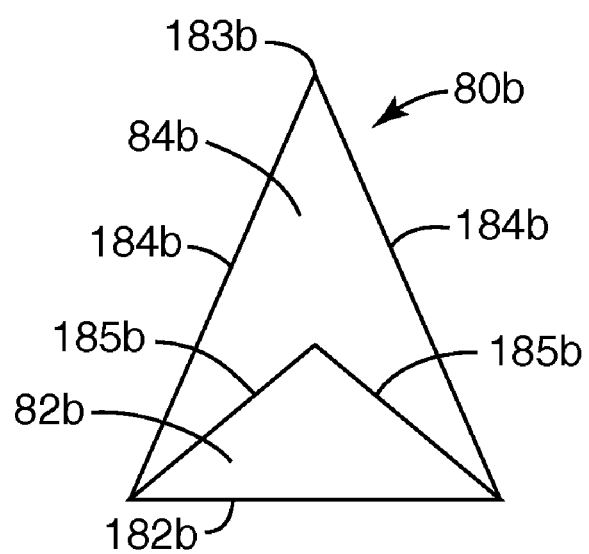

FIG. 10b shows a front view of an alternative embodiment of a compound optical element 80b. The optical element 80b includes a base 182b, an apex 183b, and converging sides 184b. As in the above embodiment, the optical element 80b comprises a first section 82b including the base 182b and a second section 84b including the apex 183b. The first section 82b is composed of a first material while the second section 84b is composed of a second material. At the interface of the first and second sections, the sides 185b of the first section 82b are joined to the base of the second section 84b, as shown.

The first and second materials used to make the first and second sections, respectively, can be two different materials having two different indexes of refraction. They can be two different optical materials having the same index of refraction. Alternatively, the first and second materials can differ in optical characteristics, for example having different degrees of transparency, while having the same or different indexes of refraction. Other permutations are also contemplated and will be apparent to those skilled in the art.

The compound optical element can have any shape having at least one converging side as described herein, and is not limited to the exemplary shape depicted in FIG. 10. Additional details relating to converging optical elements are described in co-filed and commonly assigned U.S. patent applications "LED Package With Converging Optical Element" Ser. No. 11/381,324, "LED Package With Wedge-Shaped Optical Element" Ser. No. 11,381,293, "LED Package With Encapsulated Converging Optical Element" Ser. No. 11/381,332, and "LED Package With Non-bonded Converging Optical Element" Ser. No. 11/381,334 which are incorporated herein by reference, to the extent they are not inconsistent with the foregoing disclosure.

While the invention is amenable to various modifications and alternative forms, specifics thereof have been shown by way of example in the drawings and the detailed description. It should be understood, however, that the intention is not to limit the invention to the particular embodiments described. On the contrary, the intention is to cover modifications, equivalents, and alternatives falling within the spirit and scope of the invention as defined by the appended claims.

What is claimed is:

1. A light source, comprising:
   an LED die having an emitting surface;
   an optical element including a base, an apex, and a converging side joining the base and the apex, wherein the base is optically coupled to the emitting surface;
   wherein the optical element comprises a first section including the base and that is composed of a first material;
   wherein the optical element comprises a second section including the apex and that is composed of a second material; and
   wherein the optical element directs light emitted by the LED die to produce a side emitting pattern.

2. The light source of claim 1, wherein the first material has a refractive index greater than that of the second material.

3. The light source of claim 1, wherein the side emitting pattern includes a plurality of side lobes.

4. The light source of claim 1, wherein the side emitting pattern is torroidal.

5. The light source of claim 1, wherein the side emitting pattern is asymmetric.

6. The light source of claim 1, wherein the apex resides over the emitting surface.

7. The light source of claim 1, wherein the apex is centered over the base.

8. The light source of claim 1, wherein the apex is blunted.

9. The light source of claim 1, further comprising an optically conducting layer disposed between the optical element and the emitting surface.

10. The light source of claim 1, wherein the optical element is bonded to the LED die at the emitting surface.

11. The light source of claim 1, wherein the base and the emitting surface are substantially matched in size.

12. The light source of claim 1, wherein the base is smaller than the emitting surface.

13. The light source of claim 1, wherein the first section has an index of refraction of at least 1.75.

14. The light source of claim 13, wherein at least one of the first and second sections consist of inorganic material.

15. The light source of claim 1, wherein the LED die is one of a plurality of LED dies arranged in an array.

16. The light source of claim 1, wherein the optical element is shaped as a polyhedron.

17. The light source of claim 16, wherein the base is rectangular and wherein the optical element includes four sides, each side extending between the base and the apex.

18. The light source of claim 1, wherein the base is circular.

19. A light source, comprising:
- an LED die having an emitting surface;
- an optical element including a base, an apex, and a converging side joining the base and the apex, wherein the base is optically coupled to the emitting surface;
- wherein the optical element comprises a first section including the base and that is composed of a first material, wherein the first section has an index of refraction of at least 1.75; and
- wherein the optical element comprises a second section including the apex and that is composed of a second material.

20. The light source of claim 19, wherein the first material has a refractive index greater than that of the second material.

21. The light source of claim 19, wherein the apex is centered over the base.

22. The light source of claim 19, further comprising an optically conducting layer disposed between the optical element and the emitting surface.

23. The light source of claim 19, wherein the optical element is bonded to the LED die at the emitting surface.

24. The light source of claim 19, wherein the base is smaller than the emitting surface.

25. The light source of claim 19, wherein the LED die is one of a plurality of LED dies arranged in an array.

26. A light source, comprising:
- an LED die having an emitting surface;
- an optical element including a base, an apex, and a converging side joining the base and the apex, wherein the base is optically coupled to the emitting surface, wherein the optical element is bonded to the LED die at the emitting surface;
- wherein the optical element comprises a first section including the base and that is composed of a first material; and
- wherein the optical element comprises a second section including the apex and that is composed of a second material.

* * * * *

UNITED STATES PATENT AND TRADEMARK OFFICE
CERTIFICATE OF CORRECTION

| | |
|---|---|
| PATENT NO. | : 7,390,117 B2 |
| APPLICATION NO. | : 11/381329 |
| DATED | : June 24, 2008 |
| INVENTOR(S) | : Catherine A. Leatherdale |

It is certified that error appears in the above-identified patent and that said Letters Patent is hereby corrected as shown below:

Title Page
Item [56], References Cited, U.S. PATENT DOCUMENTS, Delete "Suglmoto" and insert -- Sugimoto --, therefor.

Column 2
Line 42, Delete "PACKAGE";" and insert -- PACKAGE" (Attorney Docket No. 60217US002); --, therefor.
Line 44, Delete "ELEMENT"." and insert -- ELEMENT" (Attorney Docket No. 60216US002). --, therefor.

Column 8
Line 13, After "Package"," insert -- (Attorney Docket No. 60217US002), --.
Line 28, After "ELEMENT"," insert -- (Attorney Docket No. 60203US002), --.
Line 31, After "ARRAY"," insert -- (Attorney Docket No. 60204US002), --.
Line 33, Delete "SAME"." and insert -- SAME", (Attorney Docket No. 60914US002). --, therefor.

Column 10
Line 7, Delete "Element"." and insert -- Element" (Attorney Docket No. 60203US002). --, therefor.

Column 11
Line 4, Delete "ELEMENT"." and insert -- ELEMENT" Attorney Docket No. 60216US002. --, therefor.

UNITED STATES PATENT AND TRADEMARK OFFICE
CERTIFICATE OF CORRECTION

PATENT NO. : 7,390,117 B2
APPLICATION NO. : 11/381329
DATED : June 24, 2008
INVENTOR(S) : Catherine A. Leatherdale It is certified that error appears in the above-identified patent and that said Letters Patent is hereby corrected as shown below:

Column 12
Line 21, After "Element"" insert -- (Attorney Docket No. 62076US002), --.
Line 22, After "Element"" insert -- (Attorney Docket No. 62044US002), --.
Line 23, After "Element"" insert -- (Attorney Docket No. 62044US002), --.
Line 25, After "Element"" insert -- (Attorney Docket No. 62044US002) --.

Signed and Sealed this

Twenty-first Day of October, 2008

JON W. DUDAS
*Director of the United States Patent and Trademark Office*